(12) United States Patent
Liu et al.

(10) Patent No.: US 8,735,024 B2
(45) Date of Patent: May 27, 2014

(54) NON-PLANAR LITHOGRAPHY MASK AND SYSTEM AND METHODS

(75) Inventors: Chien-Hsuan Liu, Tainan (TW); Jen-Pan Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 67 days.

(21) Appl. No.: 13/421,235

(22) Filed: Mar. 15, 2012

(65) Prior Publication Data
US 2013/0244140 A1 Sep. 19, 2013

(51) Int. Cl.
*G03F 7/24* (2006.01)
*G03F 1/50* (2012.01)

(52) U.S. Cl.
USPC ................................................ 430/5; 355/67

(58) Field of Classification Search
USPC ........................ 430/5, 394; 378/35; 355/53, 67
See application file for complete search history.

(56) References Cited

U.S. PATENT DOCUMENTS

| 6,142,641 A | 11/2000 | Cohen et al. |
| 6,178,221 B1 | 1/2001 | Levinson et al. |
| 6,416,908 B1 * | 7/2002 | Klosner et al. .................... 430/5 |
| 2008/0204694 A1 | 8/2008 | Shu et al. |
| 2010/0015535 A1 | 1/2010 | Song et al. |

FOREIGN PATENT DOCUMENTS

JP 2006220907 8/2006

OTHER PUBLICATIONS

Korean Office Action and English Translation, Patent Applicaiton No. 10-2012-0067931, Jan. 16, 2014, 10 pages.

* cited by examiner

*Primary Examiner* — Stephen Rosasco
(74) *Attorney, Agent, or Firm* — Slater and Matsil, L.L.P.

(57) ABSTRACT

Various non-planar lithography masks, systems using such lithography masks, and methods are disclosed. An embodiment is a lithography mask comprising a lens-type transparent substrate and a reticle pattern on a surface of the lens-type transparent substrate. The reticle pattern is opaque to optical radiation. Methods for forming similar lithography masks and for using similar lithography masks are disclosed.

19 Claims, 5 Drawing Sheets

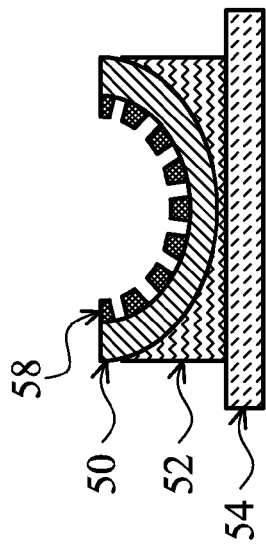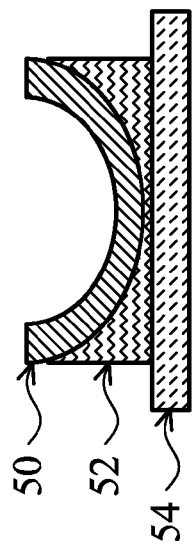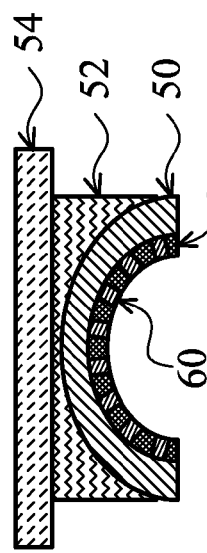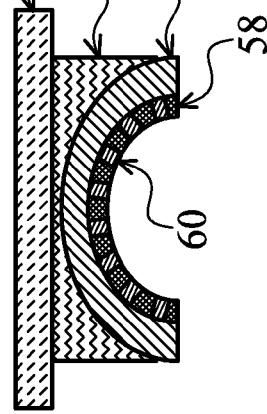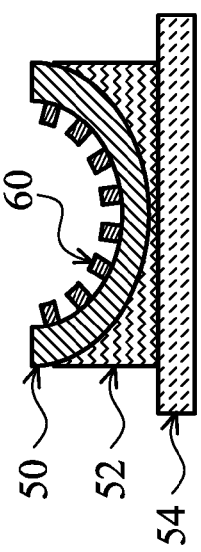
Fig. 4
Fig. 5
Fig. 6
Fig. 7
Fig. 8

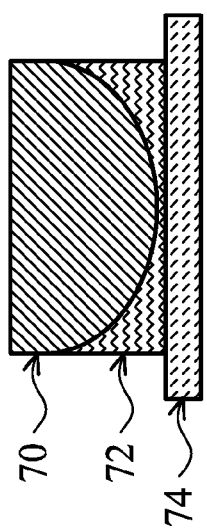
Fig. 9
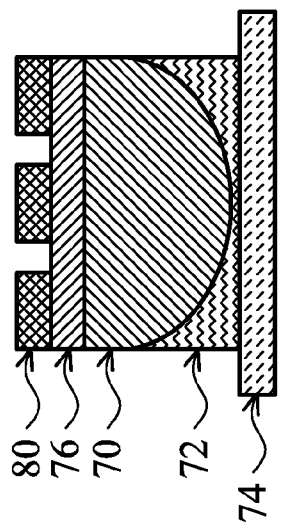
Fig. 10
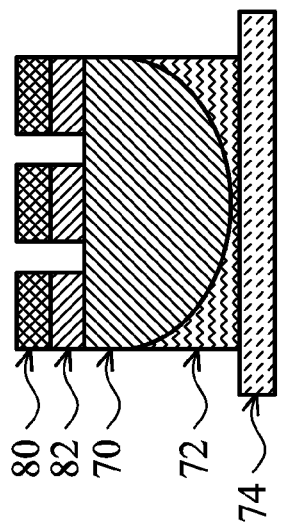
Fig. 11
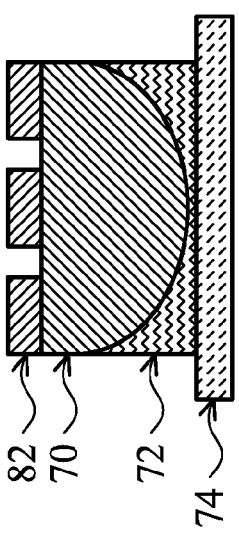
Fig. 12
Fig. 13

NON-PLANAR LITHOGRAPHY MASK AND SYSTEM AND METHODS

BACKGROUND

In semiconductor processing, multiple lithography steps are generally used to form a semiconductor chip. These steps typically include forming a photoresist over a substrate that is to be formed into the semiconductor chip, exposing the photoresist to a pattern of light generally controlled by a mask, developing the pattern in the photoresist to expose the underlying substrate, and etching the pattern in the underlying substrate. The pattern etched in the underlying substrate may be a basis for some feature formation, such as an ion impurity implantation such as for doping source and drain regions, a formation of a structure like a gate pattern, or a pattern for a conductive material such as in a metallization layer.

Advances in semiconductor processing have generally allowed for continued reduction of minimum feature sizes for semiconductor chips; however, each reduction in size typically is accompanied with its own challenges. As minimum feature size decreases, overlay concerns are typically intensified. Minimum feature size reduction allows for a greater density of features in a given area, which in turn increases the likelihood that an improperly overlaid feature can render the chip useless.

To help avoid improper overlaying of features, critical dimensions of features typically must be precise. If dimensions of features are just a small amount more than corresponding critical dimensions, the features can overlay other features. Accordingly, it is advantageous to form features with precise dimensions that are true to a design.

As previously noted, lithography steps are typically used to form these features, and at the source of the lithography steps is the mask. If the mask is not able to precisely form a pattern in a photoresist, the subsequently formed feature may not meet its critical dimension requirement. A cause for a mask not being able to precisely form a pattern may be that a source of the light is not properly oriented to the mask. This can cause a shadowing effect on a photoresist to be patterned. Further, a projection lens used in conjunction with a mask can be used multiple times with multiple masks. This extensive use of the projection lens can cause the projection lens to experience excessive heat. The excessive heat can alter physical properties of the projection lens leading to imprecise patterns in a photoresist.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 4 through 8 are a first example of a method to form a non-planar mask according to an embodiment; and FIGS. 9 through 13 are a second example of a method to form a non-planar mask according to an embodiment.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Figure 1:
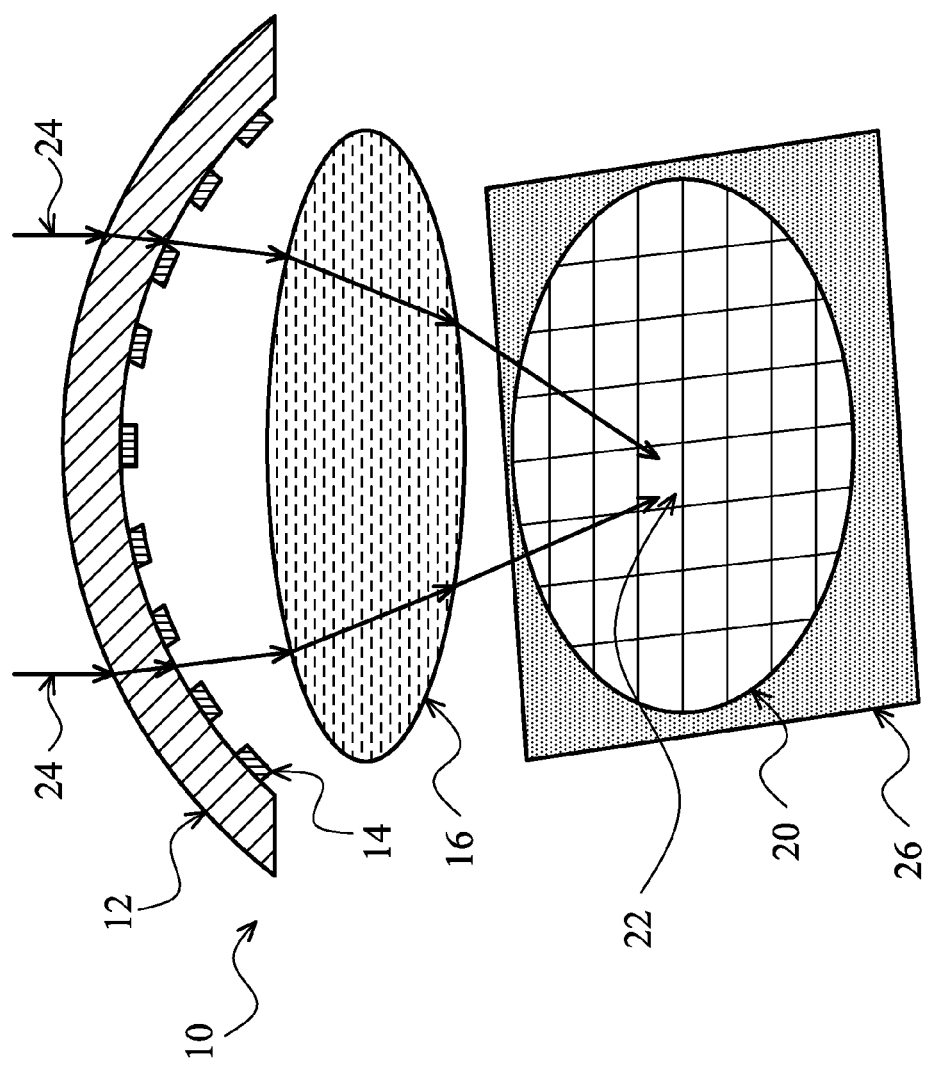
FIG. 1 is a non-planar mask and a system used in a lithography process according to an embodiment.

Embodiments will be described with respect to specific contexts, namely non-planar binary masks for photolithography. Other embodiments may also be applied, however, to other masks, such as a phase shift mask or the like. Throughout the various figures and discussion, like reference numbers refer to like components. Further, although described in a particular order, steps of various methods disclosed herein can be performed in any logical order FIG. 1 illustrates a non-planar mask 10 and a system used in a lithography process according to an embodiment. The non-planar mask 10 comprises a transparent substrate 12 and a reticle pattern 14. The transparent substrate 12 in this embodiment is a meniscus type lens with a concave surface and a convex surface. The transparent substrate 12 has a single focal point. The reticle pattern 14 is on the concave surface of the transparent substrate 12. It should be noted that in other embodiments, the reticle pattern is formed on the convex surface of the transparent substrate 12. Other components used in the lithography process and/or in the system include an optical source (not specifically depicted), a projection lens 16, a wafer 20 that includes die areas and on which a photoresist is formed for patterning using the non-planar mask 10, and a wafer holder with stepper 26.

The non-planar mask 10 is proximate the optical source, and the projection lens 16 is disposed between the non-planar mask 10 and the wafer holder 26. The convex surface of the transparent substrate 12 is proximate the optical source while the concave surface of the transparent substrate 12 is distal from the optical source. The non-planar mask 10 and the projection lens 16 are configured such that optical radiation 24 passing through non-planar mask 10 and subsequently the projection lens 16 are incident upon a die area 22 on the wafer 20 on the wafer holder with stepper 26.

In an embodiment, the optical source provides optical radiation 24 for patterning the photoresist on the wafer 20. As shown by the arrows indicating example paths of optical radiation 24 in this embodiment, the optical radiation 24 passes through the transparent substrate 12 and the projection lens 16 before impinging upon the photoresist on die area 22. As shown, the optical radiation 24 experiences refraction as it passes through each of the transparent substrate 12 and the projection lens 16 to focus a pattern of the optical radiation 24 on the photoresist.

In this embodiment, the non-planar mask 10 is a binary mask. Optical radiation 24 passes through the convex surface of the transparent substrate 12 with a degree of refraction to alter the direction of the optical radiation 24. The optical radiation 24 then passes through the concave surface of the transparent substrate 12 with a degree of refraction to alter the direction of the optical radiation 24. Some of the optical radiation 24 continues to the projection lens 16 after passing through openings of the reticle pattern 14. Other portions of the optical radiation 24 are generally prevented from passing by the reticle pattern 14, where an opaque material prevents transmission and/or an anti-reflection coating (ARC) absorbs that portion of the optical radiation 24. The optical radiation 24 passing through the reticle pattern 14 defines a pattern to be produced in the photoresist.

The optical radiation 24 that passes through the reticle pattern 14 passes through a first convex surface of the projection lens 16 and subsequently a second convex surface of the projection lens 16. At each incident convex surface, the optical radiation 24 experiences a degree of refraction to alter the direction of the optical radiation 24. After passing through the second convex surface of the projection lens 16, the optical radiation 24 is incident on the photoresist on the wafer 20 in the die area 22 with a focused and reduced size optical pattern.

As depicted in FIG. 1, the optical pattern is incident upon the die area 22. In embodiments, the wafer 20 is stepped such that each die area has the optical pattern incident upon the photoresist in that respective die area in subsequent respective steps. An appropriate wafer holder with stepper 26 can be used for stepping the wafer 20 through each exposure.

The optical pattern generally defines the pattern formed in the photoresist for a given die area. As an example, if the photoresist is a positive photoresist, the portion of the photoresist upon which the optical radiation 24 is incident, e.g., is exposed, typically will become soluble and is generally removed. Thus, the exposure generally defines the areas in which photoresist is not present for a subsequent etch in the lithography process. As another example, if the photoresist is a negative photoresist, the portion of the photoresist exposed to the optical radiation 24 typically will become insoluble and is generally is not removed for a subsequent process step. Thus, the exposure generally defines the areas in which photoresist is present for a subsequent etch in the lithography process.

A person having ordinary skill in the art will readily appreciate that variations may be made to components depicted in FIG. 1, which are contemplated within the scope of various embodiments. The projection lens 16 may or may not be in the system. For example, if refraction provided by the non-planar mask 10 is sufficient, the projection lens 16 may be omitted. Different lens types can be used for the transparent substrate 12 and the projection lens 16, as well as various combinations of lens types for the transparent substrate 12 and the projection lens 16. For example, a biconvex, plano-convex, menisus type (e.g., positive or negative), plano-concave, biconcave, or the like, lens may be used as each of the transparent substrate 12 and the projection lens 16. Various radii of curvatures of the lenses can be used, and different transparent materials can be used. Different radii and materials may affect degrees of refraction and the focus of the optical pattern. Distances between the components in the system can also be varied, which may affect the focus of the optical pattern. The determination of appropriate lens types, radii of curvature, materials, and distances between components for a given application can be made without undue experimentation by a person having ordinary skill in the art.

Figure 2:
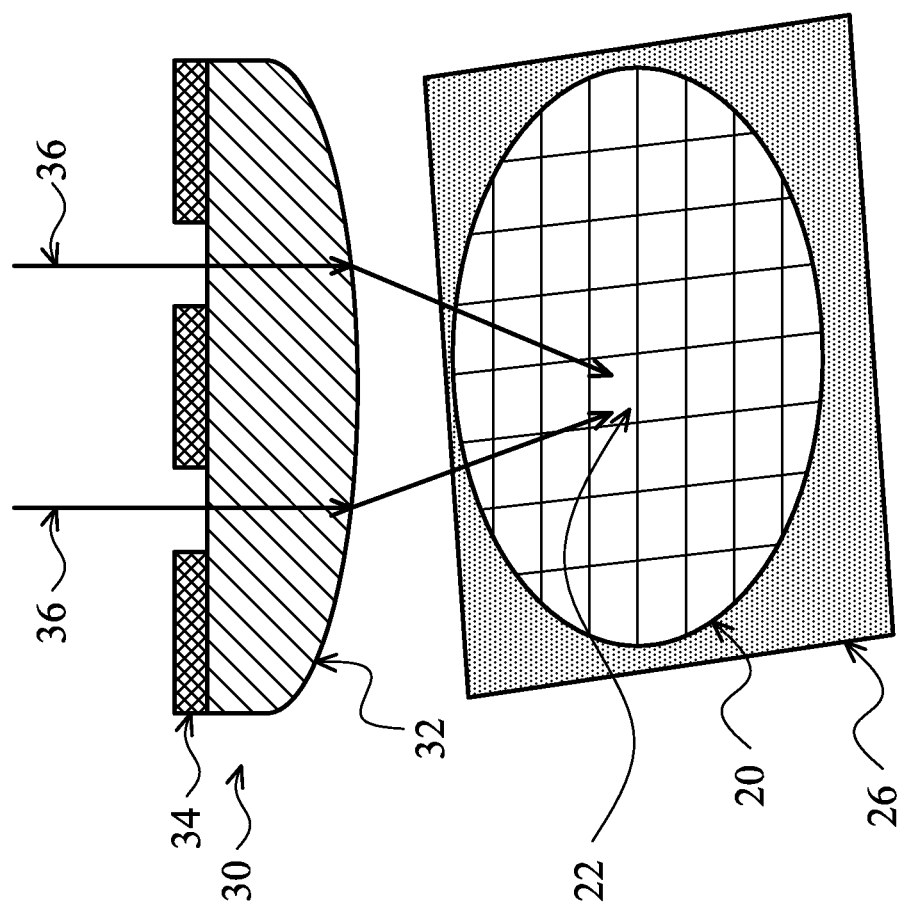
FIG. 2 is a non-planar mask and a system used in a lithography process according to another embodiment.

FIG. 2 illustrates a non-planar mask 30 and a system used in a lithography process according to another embodiment. The non-planar mask 30 comprises a transparent substrate 32 and a reticle pattern 34. The transparent substrate 32 in this embodiment is a plano-convex type lens with a planar surface and a convex surface. The transparent substrate 32 has a single focal point. The reticle pattern 34 is on the planar surface of the transparent substrate 32. It should be noted that in other embodiments, the reticle pattern is formed on the convex surface of the transparent substrate 32. Other components used in the lithography process and/or in the system include an optical source (not specifically depicted), a wafer 20 that includes die areas and on which a photoresist is formed for patterning using the non-planar mask 30, and a wafer holder with stepper 26.

The non-planar mask 30 is disposed between the optical source and the wafer holder 26. A projection lens is not used in this embodiment, although a projection lens can be used in similar embodiments. The planar surface of the transparent substrate 32 is proximate the optical source while the convex surface of the transparent substrate 32 is distal from the optical source. The non-planar mask 30 is configured such that optical radiation 36 passing through non-planar mask 30 is incident upon a die area 22 on the wafer 20 on the wafer holder with stepper 26.

In an embodiment, the optical source provides optical radiation 36 for patterning the photoresist on the wafer 20. As shown by the arrows indicating example paths of optical radiation 36 in this embodiment, the optical radiation 36 passes through the transparent substrate 32 before impinging upon the photoresist on die area 22. As shown, the optical radiation 36 experiences refraction as it passes through the transparent substrate 32 to focus a pattern of the optical radiation 36 on the photoresist.

In this embodiment, the non-planar mask 30 is a binary mask. Some optical radiation 36 passes through the planar surface of the transparent substrate 32 exposed by the reticle pattern 34. Other portions of the optical radiation 36 are generally prevented from passing by the reticle pattern 34, where an opaque material prevents transmission and/or an anti-reflection coating (ARC) absorbs that portion of the optical radiation 36. The optical radiation 36 passing through the reticle pattern 34 generally defines a pattern to be produced in the photoresist. The optical radiation 36 may or may not experience a degree of refraction from passing through the planar surface. The optical radiation 36 passes through the convex surface of the transparent substrate 32 with a degree of refraction to alter the direction of the optical radiation 36. After passing through the convex surface of the transparent substrate 32, the optical radiation 36 is incident on the photoresist on the wafer 20 in the die area 22 with a focused and reduced size optical pattern.

As depicted in FIG. 2, the optical pattern is incident upon the die area 22. In embodiments, the wafer 20 is stepped such that each die area has the optical pattern incident upon the photoresist in that respective die area in subsequent respective steps. An appropriate wafer holder with stepper 26 can be used for stepping the wafer 20 through each exposure.

As with the system in FIG. 1, various components can be modified or included in the system of FIG. 2. A projection lens may or may not be in the system. Different lens types can be used for the transparent substrate 32. Various radii of curvatures of the lenses can be used, and different transparent materials can be used. Distances between the components in the system can also be varied. The determination of appropriate lens types, radii of curvature, materials, and distances between components for a given application can be made without undue experimentation by a person having ordinary skill in the art.

Figure 3:
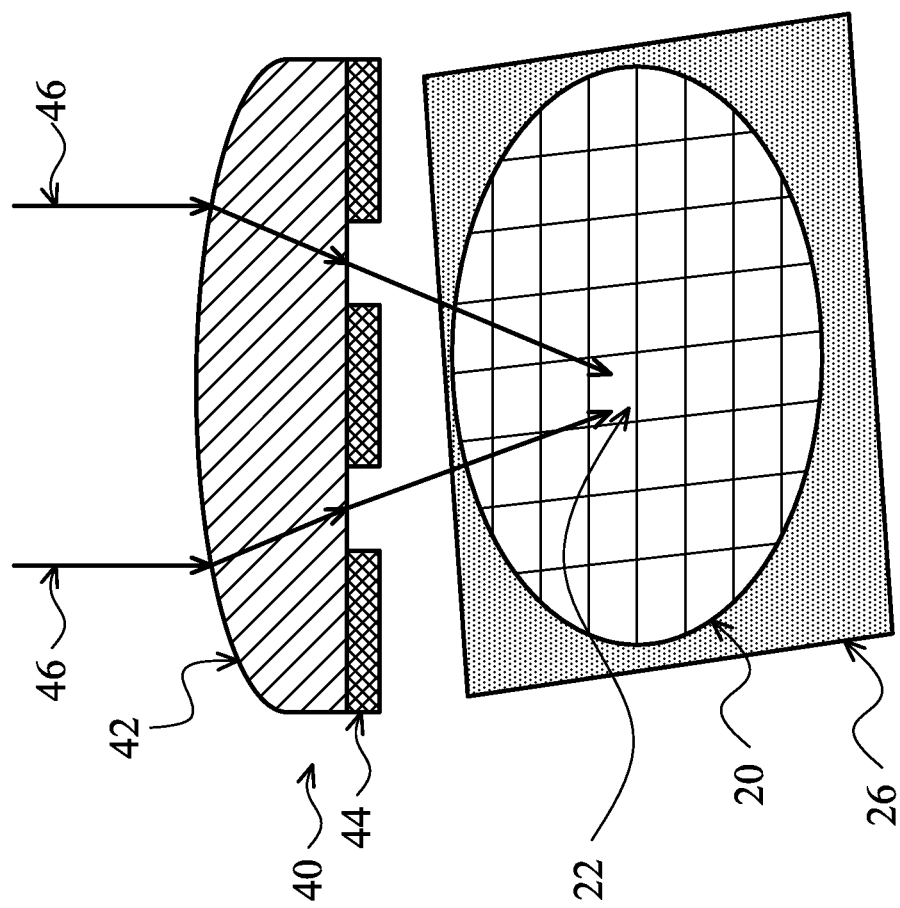
FIG. 3 is a non-planar mask and a system used in a lithography process according to yet another embodiment.

FIG. 3 illustrates a non-planar mask 40 and a system used in a lithography process according to yet another embodiment. The system in FIG. 3 is similar to the system in FIG. 2. The non-planar mask 40 comprises a transparent substrate 42 and a reticle pattern 44. The transparent substrate 42 in this embodiment is a plano-convex type lens with a planar surface and a convex surface. The transparent substrate 42 has a single focal point.

The non-planar mask 40 is disposed between the optical source and the wafer holder 26. The convex surface of the transparent substrate 42 is proximate the optical source while the planar surface of the transparent substrate 42 is distal from the optical source. The non-planar mask 40 is configured such that optical radiation 46 passing through non-planar mask 40 is incident upon a die area 22 on the wafer 20 on the wafer holder with stepper 26.

In an embodiment, the optical source provides optical radiation 46 for patterning the photoresist on the wafer 20. As shown by the arrows indicating example paths of optical radiation 46 in this embodiment, the optical radiation 46 passes through the transparent substrate 42 before impinging upon the photoresist on die area 22. As shown, the optical radiation 46 experiences refraction as it passes through the transparent substrate 42 to focus a pattern of the optical radiation 46 on the photoresist.

In this embodiment, the non-planar mask 40 is a binary mask. Optical radiation 46 passes through the convex surface of the transparent substrate 42 with a degree of refraction to alter the direction of the optical radiation 46. The optical radiation 46 passes through the planar surface of the transparent substrate 42 possibly with a degree of refraction to alter the direction of the optical radiation 46. Some of the optical radiation 46 continues towards the wafer 20 after passing through openings of the reticle pattern 44. Other portions of the optical radiation 46 are generally prevented from passing by the reticle pattern 44, where an opaque material prevents transmission and/or an anti-reflection coating (ARC) absorbs that portion of the optical radiation 46. The optical radiation 46 passing through the reticle pattern 44 defines a pattern to be produced in the photoresist. After passing through the planar surface of the transparent substrate 42, the optical radiation 46 is incident on the photoresist on the wafer 20 in the die area 22 with a focused and reduced size optical pattern.

As depicted in FIG. 3, the optical pattern is incident upon the die area 22. In embodiments, the wafer 20 is stepped such that each die area has the optical pattern incident upon the photoresist in that respective die area in subsequent respective steps. An appropriate wafer holder with stepper 26 can be used for stepping the wafer 20 through each exposure.

As with the system in FIGS. 1 and 2, various components can be modified or included in the system of FIG. 3. A projection lens may or may not be in the system. Different lens types can be used for the transparent substrate 42. Various radii of curvatures of the lenses can be used, and different transparent materials can be used. Distances between the components in the system can also be varied. The determination of appropriate lens types, radii of curvature, materials, and distances between components for a given application can be made without undue experimentation by a person having ordinary skill in the art.

FIGS. 4 through 8 illustrate a first example of a method to form a non-planar mask according to an embodiment. In FIG. 4, a non-planar transparent substrate 50 is provided. A meniscus type substrate is illustrated in this example method, although other lens type substrates can be used. The transparent substrate 50 in this example is glass, and in other embodiments, the transparent substrate 50 can be quartz, borosilicate, mylar, soda-lime glass, or the like. The transparent substrate 50 is adhered to a handle substrate 54 using, for example, an epoxy 52 to ease handling of the transparent substrate 50. The convex surface of the transparent substrate 50 is adhered to the epoxy 52 with the concave surface of the transparent substrate 50 being exposed.

In FIG. 5, a photoresist 56 is formed on the concave surface of the transparent substrate 50. The photoresist 56 is applied using, for example, spin on deposition. The photoresist 56 can be any acceptable photoresist material. In FIG. 6, the photoresist 56 is patterned to form a patterned photoresist 58. The photoresist 56 is patterned using exposure by a laser. Other embodiments contemplate other acceptable exposure techniques, such as an e-beam exposure. The photoresist 56 is baked and developed to form the patterned photoresist 58. As will become apparent, the patterned photoresist 58 is an inverse pattern of a finished reticle pattern.

In FIG. 7, a reticle pattern 60 is formed on the concave surface of the transparent substrate 50 in the openings of the pattern photoresist 58. In this embodiment, the reticle pattern 60 comprises silver emulsion, chromium, iron oxide, aluminum, the like, or a combination thereof. The reticle pattern 60 is deposited using, for example, thermal evaporation. Other deposition processes may also be used. In FIG. 8, the patterned photoresist 58 is removed, for example, by an acceptable ashing process. The formed non-planar mask can then be removed from the handle substrate 54 and the epoxy 52 and used in a photolithography system, such as depicted in FIG. 1.

FIGS. 9 through 13 illustrate a second example of a method to form a non-planar mask according to an embodiment. In FIG. 9, a non-planar transparent substrate 70 is provided. A plano-convex type substrate is illustrated in this example method, although other lens type substrates can be used. The transparent substrate 70 in this example is glass, and in other embodiments, the transparent substrate 70 can be quartz, borosilicate, mylar, soda-lime glass, or the like. The transparent substrate 70 is adhered to a handle substrate 74 using, for example, an epoxy 72 to ease handling of the transparent substrate 70. The convex surface of the transparent substrate 70 is adhered to the epoxy 72 with the planar surface of the transparent substrate 70 being exposed. As an example, a biconvex lens, such as typically used as a projection lens, can be planarized from one side or cut in half to achieve the plano-convex type substrate.

In FIG. 10, a layer of reticle material 76 is formed on the planar surface of the transparent substrate 70, and a photoresist 78 is formed on the layer of reticle material 76. The layer of reticle material 76 can be deposited using physical vapor deposition (PVD), atomic layer deposition (ALD), the like, or a combination thereof. In this embodiment, the layer of reticle material 76 comprises silver emulsion, chromium, iron oxide, aluminum, the like, or a combination thereof. The photoresist 78 is applied using, for example, spin on deposition. The photoresist 78 can be an acceptable photoresist material.

In FIG. 11, the photoresist 78 is patterned to form a patterned photoresist 80. The photoresist 78 is patterned using exposure by a laser, an e-beam exposure, or the like. The photoresist 78 is baked and developed to form the patterned photoresist 80. As will become apparent, the patterned photoresist 80 is in the pattern of a finished reticle pattern.

In FIG. 12, a reticle pattern 82 is formed on the planar surface of the transparent substrate 70. The pattern of the patterned photoresist 80 is transferred to the layer of reticle material 76 using an acceptable etching process to form the reticle pattern 82. In FIG. 13, the patterned photoresist 80 is removed, for example, by an acceptable ashing process. The formed non-planar mask can then be removed from the handle substrate 74 and the epoxy 72 and used in a photolithography system, such as depicted in FIGS. 2 and 3.

Embodiments can achieve advantages. Using a non-planar mask in a photolithography process can reduce the dimensions of a pattern of a photoresist on a wafer surface. By having a combination of lenses, the refraction and focus of an optical pattern can be more easily controlled. Further, a non-planar mask may obviate a need for a projection lens. In known processes, a projection lens may be excessively heated through continued use during different photoresist patterning steps. With an embodiment, a specific mask may be used for only one patterning steps, which may allow the mask to not be excessively heated and be cooled during other patterning steps. This can prevent some irregularities in the patterning process that may otherwise occur with thermal expansion of a projection lens which can affect the refraction and focus of light. Additionally, in some embodiments, a non-planar mask can act as a condenser to focus light onto a projection lens such that the optical source does not necessarily need to be perpendicular to the non-planar mask.

An embodiment is a system comprising a radiation source and a lithography mask. The lithography mask comprises a transparent substrate with a non-planar surface. The lithography mask is configured to transmit radiation from the radiation source in a pattern of radiation to a substrate. The transparent substrate has a single focal point.

Another embodiment is a lithography mask comprising a lens-type transparent substrate and a reticle pattern on a surface of the lens-type transparent substrate. The reticle pattern is opaque to optical radiation.

A further embodiment is a method for lithography. The method comprises projecting radiation from a radiation source; refracting the radiation using a lithography mask; and impinging a pattern of the radiation on an area of a substrate. The lithography mask comprises a lens-type transparent substrate with a single focal point and comprises a reticle pattern that is opaque to the radiation. The pattern of the radiation corresponds to the reticle pattern.

A yet further embodiment is a method for forming a lithography mask. The method comprises providing a transparent substrate, the transparent substrate having a curved surface for refraction with a single focal point; and forming a reticle pattern on a surface of the transparent substrate.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A system comprising:
    a radiation source; and
    a lithography mask comprising a transparent substrate with a non-planar surface, the lithography mask being configured to transmit radiation from the radiation source in a pattern of radiation to a substrate, the transparent substrate having a single focal point, wherein the non-planar surface is a concave surface.

2. The system of claim 1, wherein the lithography mask comprises a reticle pattern corresponding to the pattern of radiation, the reticle pattern being on the non-planar surface of the transparent substrate.

3. The system of claim 1, wherein the transparent substrate is a meniscus type lens.

4. The system of claim 1 further comprising:
    a projection lens, the lithography mask being disposed between the radiation source and the projection lens; and
    a substrate holder, the projection lens being disposed between the lithography mask and the substrate holder.

5. A system comprising:
    a radiation source; and
    a lithography mask comprising a transparent substrate with a non-planar surface, the lithography mask being configured to transmit radiation from the radiation source in a pattern of radiation to a substrate, the transparent substrate having a single focal point, wherein the lithography mask comprises a reticle pattern corresponding to the pattern of radiation, the reticle pattern being on a planar surface of the transparent substrate.

6. The system of claim 5, wherein the non-planar surface is a convex surface.

7. The system of claim 5 further comprising:
    a projection lens, the lithography mask being disposed between the radiation source and the projection lens; and
    a substrate holder, the projection lens being disposed between the lithography mask and the substrate holder.

8. A lithography mask comprising:
    a lens-type transparent substrate; and
    a reticle pattern on a surface of the lens-type transparent substrate, the reticle pattern being opaque to optical radiation, wherein the reticle pattern is on a planar surface of the transparent substrate.

9. The lithography mask of claim 8, wherein the transparent substrate has a convex surface.

10. The lithography mask of claim 8, wherein the lens-type transparent substrate has a single focal point.

11. A lithography mask comprising:
    a lens-type transparent substrate; and
    a reticle pattern on a surface of the lens-type transparent substrate, the reticle pattern being opaque to optical radiation, wherein the transparent substrate has a concave surface.

12. The lithography mask of claim 11, wherein the lens-type transparent substrate has a single focal point.

13. The lithography mask of claim 11, wherein the lens-type transparent substrate is a meniscus type lens.

14. The lithography mask of claim 11, wherein the reticle pattern is on the concave surface of the transparent substrate.

15. A method for lithography, the method comprising:
    projecting radiation from a radiation source;
    refracting the radiation using a lithography mask, the lithography mask comprising a lens-type transparent substrate with a single focal point and comprising a reticle pattern that is opaque to the radiation, the lens-type transparent substrate (i) being a meniscus-type lens or (ii) comprising a planar surface with the reticle pattern thereon; and
    impinging a pattern of the radiation on an area of a substrate, the pattern of the radiation corresponding to the reticle pattern.

16. The method of claim 15 further comprising refracting a scaled pattern of the radiation using a projection lens.

17. The method of claim 15 further comprising stepping the substrate such that the pattern of the radiation is impinged upon a different area of the substrate.

18. The method of claim 15, wherein the lens-type transparent substrate is the meniscus-type lens, the reticle pattern being on a concave surface of the lens-type transparent substrate.

19. The method of claim 15, wherein the lens-type transparent substrate comprises the planar surface with the reticle pattern thereon.

* * * * *